(12) United States Patent
Coelho, Jr. et al.

(10) Patent No.: US 6,802,046 B2
(45) Date of Patent: Oct. 5, 2004

(54) TIME DOMAIN MEASUREMENT SYSTEMS AND METHODS

(75) Inventors: Jefferson Athayde Coelho, Jr., Santa Rosa, CA (US); Michael Joseph Resso, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 343 days.

(21) Appl. No.: 10/136,553

(22) Filed: May 1, 2002

(65) Prior Publication Data

US 2003/0208734 A1 Nov. 6, 2003

(51) Int. Cl.[7] .......................... G06F 17/50; G06F 19/00; G06F 11/26; G01R 27/28; G01R 31/14
(52) U.S. Cl. ............................ 716/4; 702/118; 702/125; 714/733; 714/734; 714/735; 714/736; 714/738; 324/750; 324/755; 324/763
(58) Field of Search ............................... 716/4; 702/118, 702/125; 714/733–736, 738; 324/750, 755, 763

(56) References Cited

U.S. PATENT DOCUMENTS

| 6,005,381 A | * 12/1999 | Saunders et al. ........ 324/76.39 |
| 6,518,741 B1 | * 2/2003 | Okada ..................... 324/76.19 |

FOREIGN PATENT DOCUMENTS

| JP | 58215566 A | * 12/1983 | ........... G01R/23/02 |
| JP | 03128626 A | * 5/1991 | ............ H02Y/3/38 |
| JP | 08161000 A | * 6/1996 | ............ G10L/9/18 |
| JP | 100788807 A | * 3/1998 | ......... G05B/19/048 |
| JP | 10143199 A | * 5/1998 | ............. G10L/9/14 |
| JP | 11032014 A | * 2/1999 | ........... H04B/14/04 |
| JP | 05336009 A | * 12/1999 | ............. H04B/3/46 |
| JP | 2000031864 A | * 1/2000 | ........... H04B/1/707 |
| JP | 2000078000 A | * 3/2000 | ............. H03L/7/00 |
| JP | 2001142463 A | * 5/2001 | ............. G10H/7/02 |
| JP | 2001211212 A | * 8/2001 | ........... H04L/25/03 |

OTHER PUBLICATIONS

"Agillent 86100A Infiniium DCA Time domain Reflectometry", Agilent Technologies, www.agilent.com, printed in USA 11/00, Nov. 2000, pp. 1–6.

"Improving TDR/TDT Measurements Using Normalization", Agilent Technologies, www.agilent.com, printed in USA, Apr. 17, 2001, pp. 1–13.

* cited by examiner

Primary Examiner—Vuthe Siek
Assistant Examiner—Phallak Kik

(57) ABSTRACT

Systems for performing time domain measurements of a device under test (DUT) are provided. One such system includes a normalization system that receives information corresponding to a model of a test system used for providing differential input signals to a DUT, receives information corresponding to first and second differential input signals provided to the DUT, receives information corresponding to first and second reflected waveforms corresponding to the DUT response to the first and second differential input signals, and computes first and second normalized waveforms using at least a first inverse transfer function of the test system, the first and second normalized waveforms including fewer test system error components than the first and second reflected waveforms, respectively. Methods, computer-readable media and other systems also are provided.

21 Claims, 7 Drawing Sheets

TIME DOMAIN MEASUREMENT SYSTEMS AND METHODS

FIELD OF THE INVENTION

The present invention generally relates to electrical system testing. In particular, the invention relates to systems and methods for performing time domain measurements, such as differential impedance measurements, of electrical systems.

DESCRIPTION OF THE RELATED ART

Several types of time domain measurements are used to determine characteristics of electrical systems. For instance, time domain reflectometry (TDR) measurements involve propagating a signal down a transmission line to a device under test (DUT) and then measuring the reflections from the DUT. The reflections then are evaluated to determine characteristics, such as discontinuities and/or impedances, of the DUT.

Time domain transmission (TDT) measurements also are used. TDT measurements are made by propagating a signal through a DUT. Parameters typically measured by TDT include gain and propagation delay. TDT measurements also can characterize crosstalk between traces.

Typically, a digital communications analyzer (DCA) is used to perform TDR/TDT measurements. A DCA is connected to a DUT via transmission media, such as cables, connectors and/or probes, that propagate signals to and/or from the DUT. A step generator of the DCA typically is used to generate test signals for providing to the DUT and an oscilloscope of the DCA is used to view the DUT response.

Unfortunately, a DCA can introduce error in TDR/TDT measurements. By way of example, the transmission media between the step generator, the DUT and the oscilloscope can affect measurement results. In particular, impedance mismatches and imperfect connectors add reflections to the actual signal being measured. These can distort the signal and make it difficult to determine which reflections are from the DUT and which are from other sources. Additionally, cable losses are frequency dependent and can cause the risetime of edges to "droop" as they approach their final values.

Oscilloscopes also can introduce errors into measurements. For instance, the finite bandwidth of an oscilloscope translates to limited risetime. Edges with risetimes less than the minimum risetime of the oscilloscope are measured slower than the actual risetimes. Therefore, when measuring a DUT response to an edge, the limited risetime of an oscilloscope may distort or hide some of the DUT response.

The shape of the step stimulus also can be important for accurate TDR/TDT measurements. This is because the DUT responds not only to the step, but also to aberrations on the step, such as overshoot and non-flatness. Therefore, if the step overshoot is substantial, the DUT response can be more difficult to interpret.

As is known, waveform subtraction has been used to reduce the effects of measurement errors. Waveform subtraction involves obtaining a reference waveform from a known "good" reference device, and then subtracting the reference waveform from a waveform measured from the DUT. The result shows how the DUT response differs from the reference response. This technique removes error terms common to both the reference and the DUT waveforms, such as trigger coupling, channel crosstalk and reflections from the cables and connectors.

Waveform subtraction, however, has several shortcomings. First, it requires that a known "good" reference DUT exists. In some cases a "good" DUT may not exist or may not be readily available. Second, since the waveform that results from the subtraction process is a description of how the DUT response differs from the reference response, the errors introduced by the test system are difficult to isolate from the actual DUT response.

Based on the foregoing, it should be appreciated that there is a need for improved systems and methods that address the aforementioned and/or other perceived shortcomings of the prior art.

SUMMARY OF THE INVENTION

Systems and methods of the present invention enable time domain reflectometry (TDR) and/or time domain transmission (TDT) measurements to be more accurately produced compared with prior art TDR/TDT techniques. Normalization provided by these systems and methods can be used in TDR/TDT measurements to remove oscilloscope response, step aberrations, cable losses and/or reflections so that the response measured is that of the device under test (DUT). In addition, normalization can be used to predict how the DUT would respond to an ideal step of an arbitrary risetime. In some embodiments, normalization can be implemented by a time domain measuring system, which may not require the use of external controllers, multiple step generators and/or risetime converters for performing testing.

In this regard, an embodiment of a system of the invention for performing time domain measurements of a DUT includes a normalization system. The normalization system receives information corresponding to a model of a test system that is used for providing differential input signals to a DUT. The normalization system also receives information corresponding to first and second differential input signals provided to the DUT, as well as information corresponding to first and second reflected waveforms corresponding to the DUT response to the first and second differential input signals. The normalization system then computes first and second normalized waveforms using at least a first inverse transfer function of the test system. Note, the first and second normalized waveforms include fewer test system error components than the first and second reflected waveforms, respectively.

An embodiment of a method of the invention for performing time domain measurements of a DUT includes: providing a model of a test system used for providing differential input signals to a DUT; receiving information corresponding to first and second differential input signals provided to the DUT; receiving information corresponding to first and second reflected waveforms corresponding to the DUT response to the first and second differential input signals; and computing first and second normalized waveforms using at least a first inverse transfer function of the test system, the first and second normalized waveforms including fewer test system error components than the first and second reflected waveforms, respectively.

Computer-readable media also are provided. In this regard, an embodiment of a computer-readable medium of the invention for performing time domain measurements of a DUT includes: logic configured to provide a model of a test system used for providing differential input signals to a DUT; logic configured to receive information corresponding to first and second differential input signals provided to the DUT; logic configured to receive information corresponding to first and second reflected waveforms corresponding to the DUT response to the first and second differential input signals; and logic configured to compute first and second normalized waveforms using at least a first inverse transfer function of the test system, the first and second normalized waveforms including fewer test system error components than the first and second reflected waveforms, respectively.

Clearly, some embodiments of the invention may not exhibit one or more of the advantages and/or properties set forth above. Additionally, other systems, methods, features and/or advantages of the present invention will be or may become apparent to one with skill in the art upon examination of the following drawings and detailed description. It is intended that all such additional systems, methods, features and/or advantages be included within this description, be within the scope of the present invention, and be protected by the accompanying claims.

BRIEF DESCRIPTION OF THE DRAWINGS

The present invention, as defined in the claims, can be better understood with reference to the following drawings. The drawings are not necessarily to scale, emphasis instead being placed on clearly illustrating the principles of the present invention.

DETAILED DESCRIPTION

As will be described in greater detail below, systems and methods of the present invention enables accurate production of time domain reflectometry (TDR) and/or time domain transmission (TDT) measurements. This is accomplished by normalizing TDR/TDT measurements to reduce oscilloscope response, step aberrations, transmission media losses and/or transmission media reflections. In this manner, a measured response that more directly corresponds to the device under test (DUT) can be provided. Typically, normalization is implemented by a time domain measuring system (TDMS) that includes a normalization system.

Figure 1:
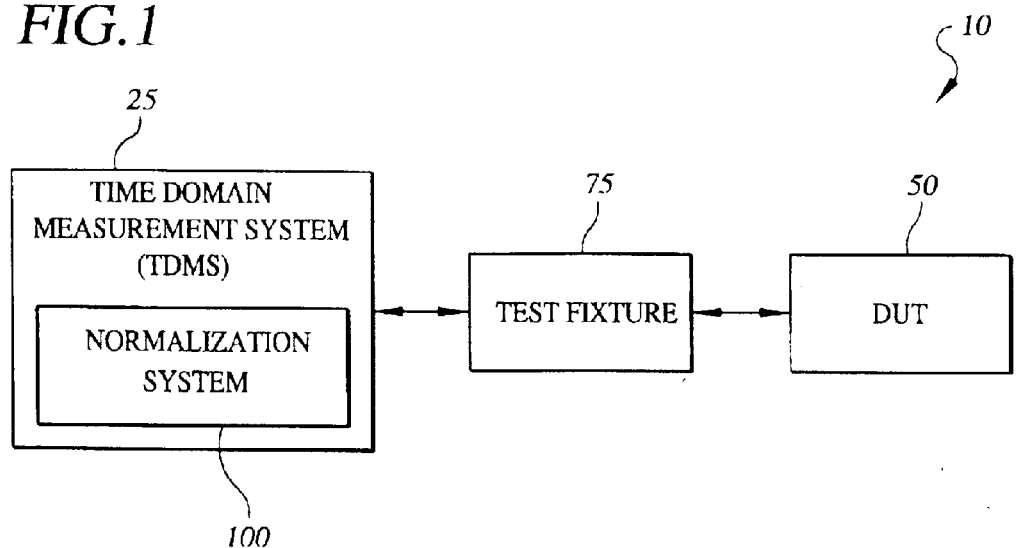
FIG. 1 is a schematic diagram depicting a representative embodiment of a system of the present invention.

Referring now to the drawings, wherein like reference numerals indicate corresponding components throughout the several views, FIG. 1 is a schematic diagram that depicts an embodiment of a system 10 of the present invention. As shown in FIG. 1, system 10 includes a TDMS 25 that incorporates a normalization system 100. TDMS 25 electrically communicates with a DUT 50, such as via an intermediately disposed test fixture 75.

TDMS 25 provides input signals to the DUT and receives corresponding output signals from the DUT in response to the input signals. Note, measurements performed when only one input signal is provided by TDMS 25 to DUT 50 are referred to as single-ended measurements. Measurements performed with two input signals are referred to as differential measurements.

Figure 2:
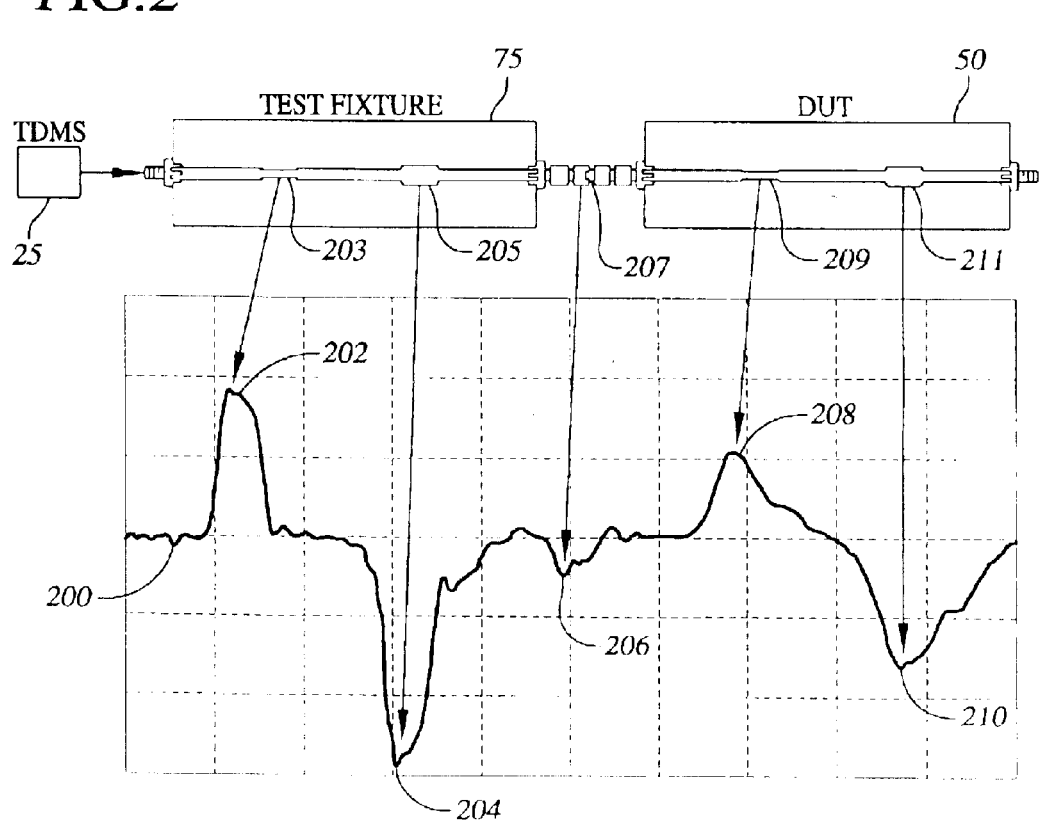
FIG. 2 is a schematic diagram depicting an embodiment of the system of FIG. 1 that correlates various features of the system with a representative reflected waveform.

FIG. 2 illustrates the effect that cables and connectors can have on TDR/TDT measurements. In FIG. 2, TDMS 25 has provided one input signal to DUT 50 via test fixture 75. Waveform 200 represents the voltage measured by TDMS 25 during a given time interval. Thus, waveform 200 is the result of the overlap of the input signal (incident wave) and the output signal (reflected wave).

Various circuit elements and/or connections cause the reflections evident in waveform 200. For instance, peak 202 corresponds to connection 203, peak 204 corresponds to connection 205, peak 206 corresponds to connection 207, peak 208 corresponds to connection 209, and peak 210 corresponds to connection 211. Note that the rounded transition of the waveform to its baseline level can be attributed to cable loss.

The example of FIG. 2 uses two identical printed circuit boards (PCBs), i.e., one for the test fixture and another for the DUT, to model the measurement. The PCBs each include a 50Ω trace with two discontinuities. Note that the response (waveform 200) shows the reflections of the second PCB to be different from the reflections of the first PCB. In particular, the first discontinuity 202 is accurately measured, but each succeeding discontinuity is measured with less accuracy as the transmitted step degrades and multiple reflections occur. Thus, the two identical PCBs show different responses. As will be described in greater detail later, normalization can correct for much of the reflections/losses exhibited by components other than the DUT.

In some embodiments, normalization can be used to predict how a DUT should respond to an ideal step of a specified, e.g., user-specified, risetime. Preferably, only one step generator and one calibration process are required. Therefore, no risetime converters may be necessary, and the calibration standards used need not be related to the DUT. Additionally, unlike a risetime converter, normalization also can increase the bandwidth, i.e., decrease the risetime of the system, by some amount depending on the noise floor. This means that when more bandwidth is critical, such as when trying to locate a short discontinuity along a transmission line, the waveform data acquired by an oscilloscope of the system can be "squeezed" for more useful information than that previously attainable using a risetime converter.

Figure 3:
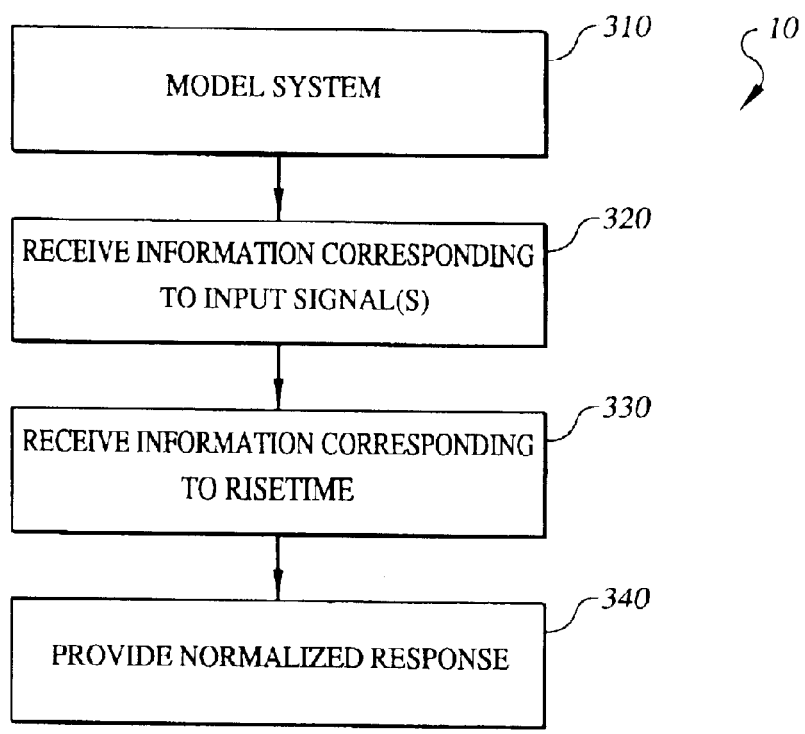
FIG. 3 is a flowchart depicting functionality that can be associated with the embodiment of the time domain measuring system of FIG. 1.

Functionality of a representative embodiment of a TDMS of the invention is depicted in the flowchart of FIG. 3. As shown in FIG. 3, functionality of the TDMS system (or method) may be construed as beginning at block 310, where a model of the electrical system corresponding to the test system is constructed. In particular, the model corresponds to the input signal generator of the TDMS and the test fixture. In block 320, information corresponding to input signals provided to the DUT is received. In block 330, information corresponding to risetime is received. Thereafter, such as depicted in block 340, a normalized response is provided. More specifically, output signals are constructed using the inverse transfer function of the model. This reduces errors introduced by the limitations of cables, connectors, oscilloscope and/or input signal generator. Thus, the normalized response preferably corresponds to ideal test fixtures. Such a response is depicted in FIG. 4.

Figure 4:
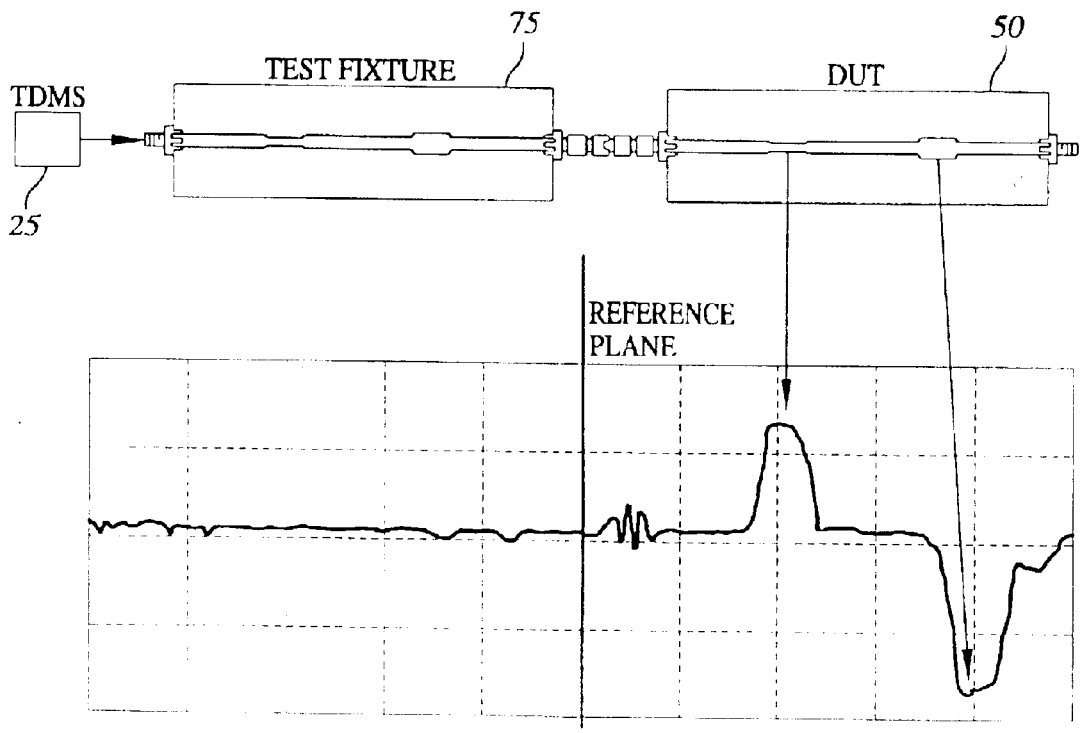
FIG. 4 is a schematic diagram depicting the system of FIG. 1 that correlates various features of the system with a representative reflected waveform with test fixture errors removed.

As shown in FIG. 4, and with brief reference again to FIG. 2, it is shown that the TDMS of the invention enables errors attributable to the test fixture to be removed. In FIG. 4, the boundary between the test fixture 75 and the DUT 50 is referred to as the reference plane. Generally, the position of the reference plane can be inferred by measurements performed during data acquisition (blocks 320 and 330) or can be established by the user directly. Note that the normalized response of the second PCB (DUT) matches the response measured earlier of the first PCB (FIG. 2). Also note, in the embodiment of FIGS. 2 and 4, the TDMS has utilized single-ended measurements, i.e., one channel measurements.

In some of the embodiments, calibration measurements that characterize the test system are made with all cables and connections in place, but typically without the DUT. TDR/TDT can be accomplished with an oscilloscope and step generator or with a frequency-domain network analyzer and swept sinewave source. Although normalization may be applied in either case, the calibration process for the network analyzer/swept source solution requires three measurements, whereas only two are required for the oscilloscope/step generator solution, as will be described in detail.

The first part of the TDR/TDT calibration reduces systematic errors due to trigger coupling, channel crosstalk and/or reflections from cables and connectors. For TDR calibration, the DUT is replaced by a short circuit. The frequency response of the test system is derived from the measured short. Note that a short circuit termination is preferable to an open circuit termination. When a step transition hits an open circuit at the end of an actual transmission line, some of the energy is lost due to radiation rather than being reflected. Therefore, a short that closely approximates a perfect short termination should be used. This is because the calibration process typically assumes a perfect short circuit termination. Any non-ideal components in the measured short typically are attributed to the test system. If any of the non-ideal components are due to the short itself, the filter may attempt to correct for error terms that do not exist in the test system. By attempting to correct for errors that do not exist, the filter can actually add error terms into the normalized measurement results.

The second part of the calibration generates a digital filter. Unlike the errors removed by subtracting the first calibration signal, the errors removed by the filter typically are proportional to the amplitude of the DUT response. For TDR, this is done by replacing the DUT with a termination having an impedance equal to the characteristic impedance of the transmission line, typically 50Ω. If the termination is properly matched, all of the energy that reaches it will be absorbed. The only reflections measured are attributable to discontinuities along the transmission line.

In both cases, the measured waveforms typically are stored and subtracted directly from the measured DUT response before the response is filtered. Ideally, these calibration waveforms are flat lines. Any non-flatness or "ringing" is superimposed on the measured DUT response and represents a potential measurement error source. These errors are not related to the magnitude of the response of the DUT. Therefore, it typically is valid to subtract them directly.

For TDT calibration, the transmission through-path is connected without the DUT. The frequency response of the test system is then measured with the aid of the step stimulus. With this information, a digital filter can be computed that should compensate for errors due to anomalies in the frequency response of the test system.

Secondary reflections caused by the impedance mismatch between the test port and the transmission media also can be corrected. With the oscilloscope/step generator TDR/TDT solution, airlines can separate the primary reflection from the secondary reflection. Time-windowing is optionally used to remove the secondary reflections. With the network analyzer/swept source solution, a third calibration is used.

The impedance mismatch between test port and transmission media reflects a portion of the primary reflection back towards the DUT. A secondary reflection from the DUT then may be measured.

In the TDR/TDT measurements made with an oscilloscope/step generator, a section of airline may be placed between the test port and the DUT to provide time separation between the primary reflection and secondary reflections. After adequate separation has been achieved, a time window can be selected that does not include the undesirable secondary reflections.

In TDR/TDT measurements made with a network analyzer/swept source, time windowing is cumbersome, thus a third calibration measurement typically is used.

The digital filter describes how the frequency response of the test system varies from the ideal. If the calibration signal were passed through the filter, the result should be the ideal response. The filter removes errors by attenuating or amplifying and phase-shifting components of the frequency response as necessary. An example of a normalization filter that can be used in is a four-term, frequency-domain sum of cosines window.

Consider, for example, overshoot on the step stimulus. The frequency, response of the DUT typically includes unwanted response to the overshoot. During normalization, the filter can phase-shift the frequencies responsible for the overshoot and, thus, attenuate the DUT response to the overshoot. Similarly, the filter corrects for cable losses due to attenuation of high frequencies by boosting high frequency components in the DUT responses to their proper levels.

In summary, single-ended normalization typically entails:

1) Sampling system response to prescribed inputs: this step requires the acquisition of waveforms for the no reflection case (a 50Ω load can be connected at the reference plane) and the full reflection case (a short can be connected at the reference plane). The system response is expressed by the reflected waveform, computed as $W_0-W_{50}$, where $W_0$ and $W_{50}$ represent the waveforms for the short and 50Ω cases, respectively.

2) Computation of the inverse transfer function for the system: the reflected waveform is the system response for an idealized step input; therefore, its derivative yields the system response for an idealized impulse. The Fast Fourier Transform (FFT) for the impulse response corresponds to the system transfer function H(s). The calculation of the inverse transfer function $H^{-1}(s)$ is straightforward.

3) Calculation of filtering function: the bandwidth for the low pass filter is a function of the risetime, e.g., the risetime selected by the user. Thus, if the filtering transfer function is F(s), the deconvolution function in the frequency domain is given by the product $D(s)=H^{-1}(s) F(s)$. Note that changes in timebase settings (sweep/delay), record length, and risetime affect F(s).

4) Normalization: Provided the timebase and/or acquisition settings are not changed, the normalized response r(t) for the waveform w(t) is given by

| 4.1) | W(s) = FFT (w(t)) | FFT transform for the input waveform |
| 4.2) | R(s) = D(s)W(s) | Deconvolution |
| 4.3) | r(t) = IFFT(R(s)) | Inverse FFT |

Differential Normalization

Embodiments of the TDMS also can perform normalization of differential measurements. Note that differential circuits are characterized by coupling between signals carried by the test fixture to the DUT. Cable and trace geometry, dielectric properties of the insulation material, among other factors influence the degree of coupling between the signal conductors.

Figure 5:
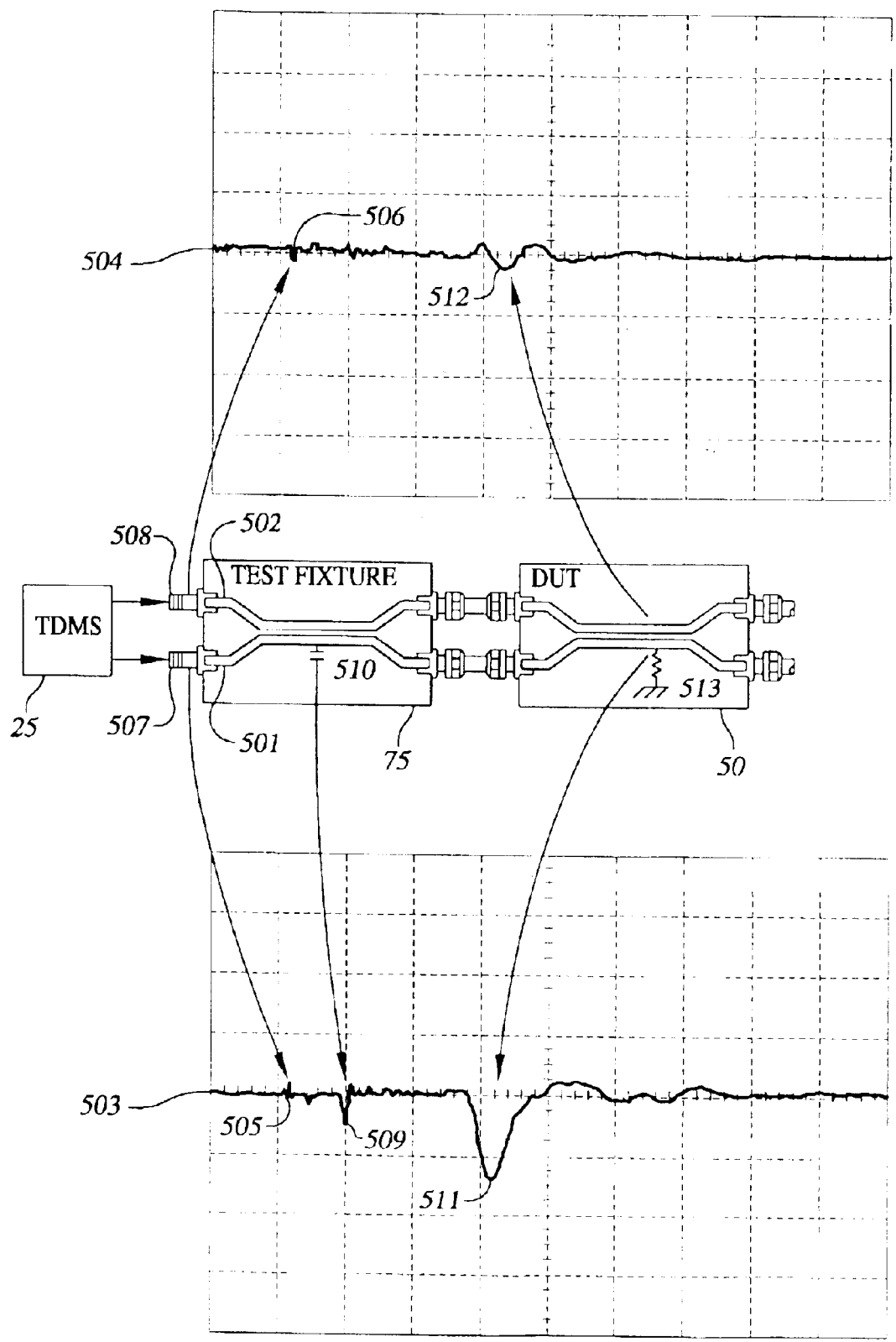
FIG. 5 is a schematic diagram depicting an embodiment of the system of FIG. 1 that correlates various features of the system to representative reflected differential waveforms.

FIG. 5 illustrates the effect that cables and connectors can have on TDR/TDT differential measurements. In FIG. 5, TDMS 25 has provided a first input signal to a first channel 501 of test fixture 75 and DUT 50, and a second input signal to a second channel 502 of the test fixture and DUT. Waveform 503 of the first channel is generated in response to the first input and waveform 504 of the second channel is generated in response to the second input. As in the single-ended case, impedance discontinuities introduced by circuit elements/connectors cause reflections evident in waveforms 503 and 504. For instance, peaks 505 and 506 correspond to connectors 507 and 508, respectively; peak 509 corresponds to the added capacitance 510, and peak 511 corresponds to the resistance 513, while peak 512 in the second channel is caused by peak 511.

Figure 6:
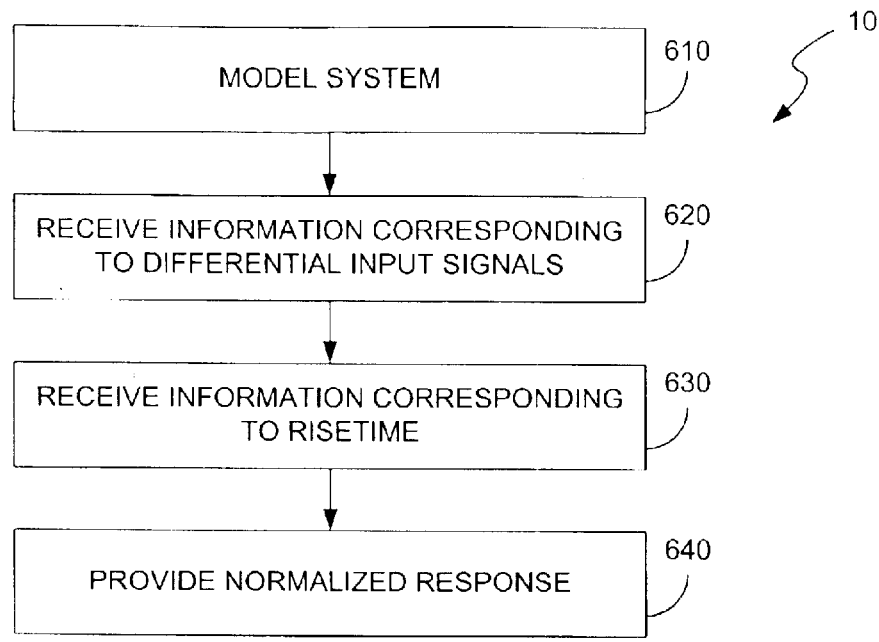
FIG. 6 is a flowchart depicting functionality that can be associated with the embodiment of the time domain measuring system of FIG. 5.

The functionality of a representative embodiment of a TDMS of the invention that can accommodate differential measurements is depicted by the flowchart of FIG. 6. As shown in FIG. 6, functionality of the TDMS system (or method) may be construed as beginning at block 610, where a model corresponding to the test system is constructed. In block 620, information corresponding to input signals provided to the DUT is received. In block 630, information corresponding to risetime is received and, thereafter, such as depicted in block 640, a normalized response is provided.

As mentioned before, at least some of the functionality described in relation to a TDMS can be attributed to normalization systems of the invention. Normalization systems 100 can be implemented in software, firmware, hardware, or a combination thereof. When implemented in hardware, normalization system 100 can be implemented with any or a combination of various technologies. When implemented in software, a normalization system 100 can be a program(s) that is executable by a computer or processor-based device ("computer"), an example of which is depicted schematically in FIG. 7.

Figure 7:
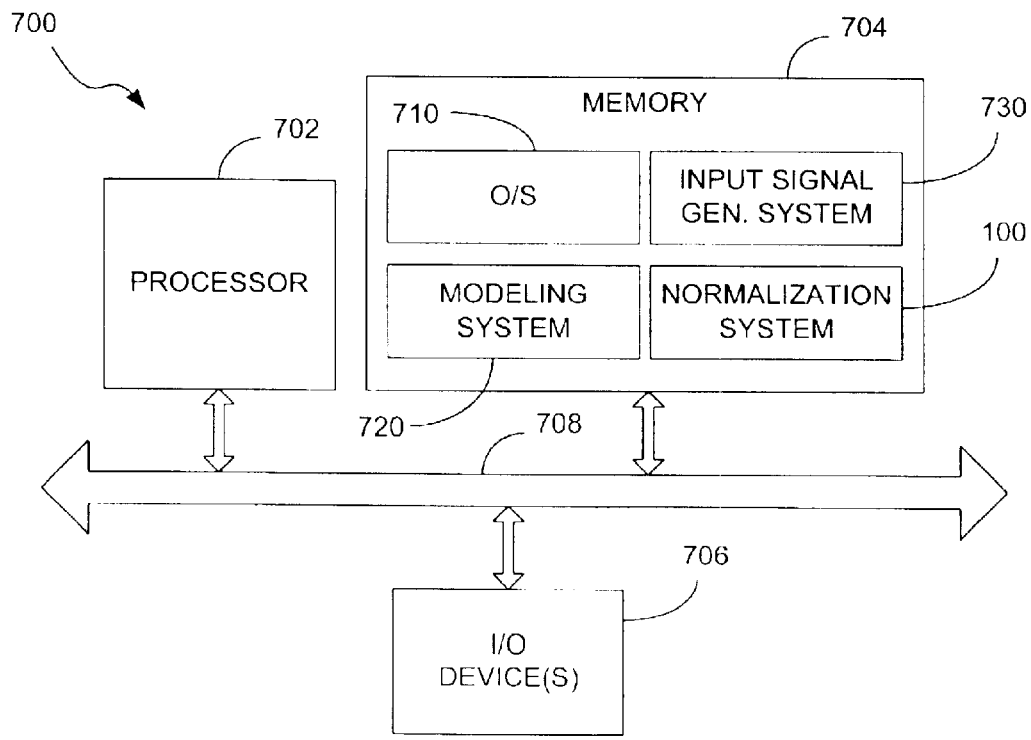
FIG. 7 is a schematic diagram depicting an embodiment of a computer or processor-based device that can be used to implement at least some embodiments of the normalization system of the present invention.

Generally, in terms of hardware architecture, computer 700 of FIG. 7 includes a processor 702, memory 704, and one or more input and/or output (I/O) devices 706 (or peripherals) that are communicatively coupled via a local interface 608. Processor 702 can be a hardware device configured to execute software that can be stored in memory 704. Memory 704 can include any combination of volatile memory elements, random access memory and/or nonvolatile memory elements. Moreover, memory 704 can incorporate electronic, magnetic, optical, and/or other types of storage media. Note that memory 704 can have a distributed architecture, where various components are situated remote from one another, but can be accessed by processor 702.

The software in memory 704 can include one or more separate programs, each of which comprises an ordered listing of executable instructions for implementing logical functions. In FIG. 7, the software in the memory 704 includes normalization system 100, a modeling system 720, an input signal generating system 730, and a suitable operating system (O/S) 710. Modeling system 720 constructs the model(s) of the test system as described before. Input signal generating system 730 provides control inputs to a signal generator that is used to provide input signals to a DUT. The operating system 710 controls the execution of other computer programs, such as normalization system 100.

The I/O device(s) 706 can include input devices, such as a keypad, for example. I/O device(s) 706 also can include output devices, such as a display device and a signal generator, for example. I/O device(s) 706 may further include devices that are configured to communicate both inputs and outputs, such as a network communication port, for example.

When normalization system 100 is implemented in software, it should be noted that the normalization system can be stored on any computer-readable medium for use by or in connection with any computer-related system or method. In the context of this document, a computer-readable medium is an electronic, magnetic, optical, or other physical device or means that can contain or store a computer program for use by or in connection with a computer-related system or method. Normalization system 100 can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. Thus, a computer-readable medium can be, for example but not limited to, an electronic, magnetic, optical, electromagnetic, infrared, or semiconductor system, apparatus, device, or propagation medium.

Reference will now be made to the flowchart of FIG. 8, which depicts the functionality of a representative embodiment of a normalization system 100 that is capable of performing at least one of single-ended and differential TDR/TDT measurements. In this regard, each block of the flowchart represents a module segment or portion of code that comprises one or more executable instructions, or logic for implementing the specified logical function(s). It should also be noted that in some alternative implementations the functions noted in various blocks of FIG. 8, or any other of the accompanying flowcharts, may occur out of the order in which they are depicted. For example, two blocks shown in succession in FIG. 8 may, in fact, be executed substantially concurrently. In other embodiments, the blocks may sometimes be executed in the reverse order depending upon the functionality involved.

Figure 8:
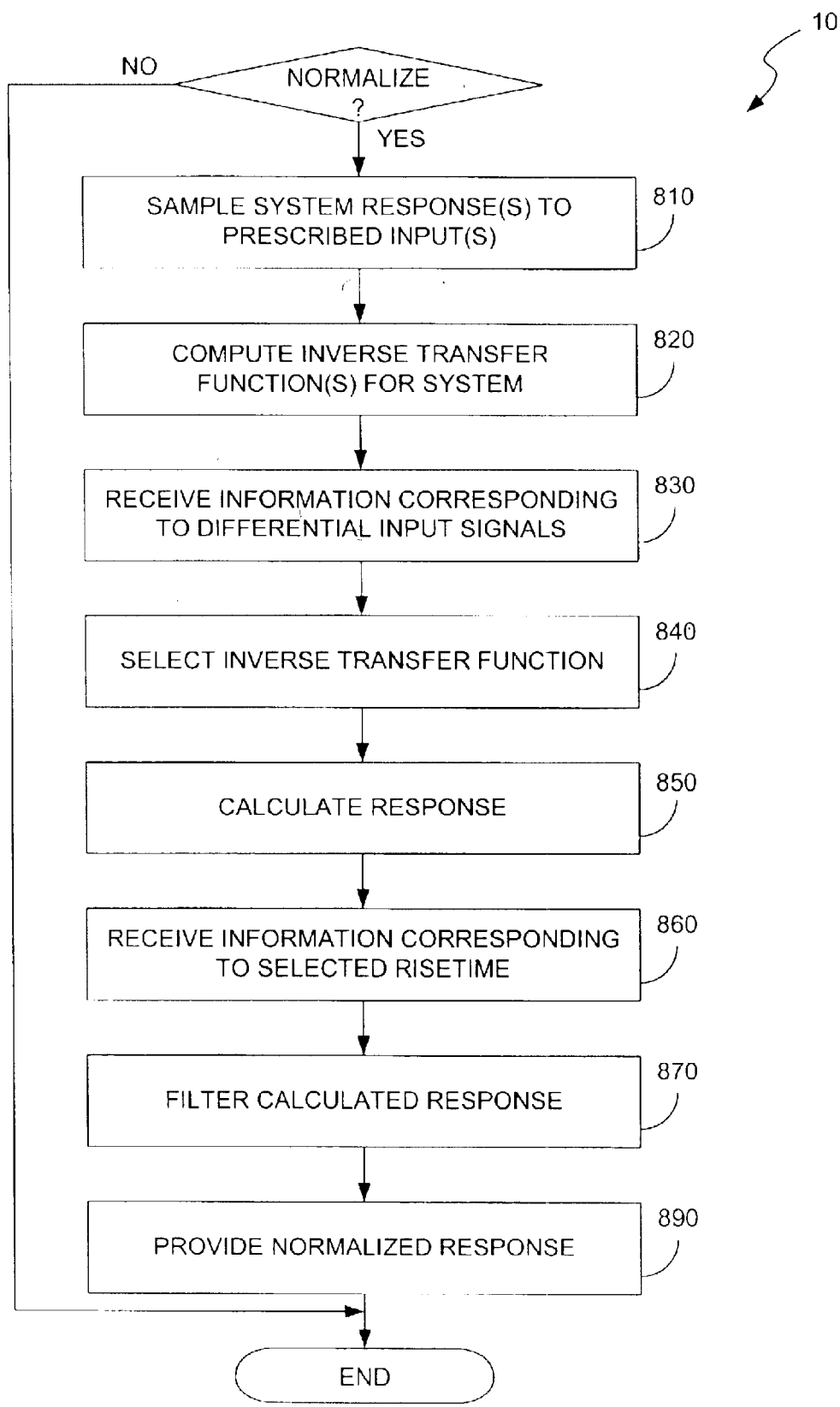
FIG. 8 is a flowchart depicting functionality that can be associated with the embodiment of the normalization system of FIG. 7.

As shown in FIG. 8, functionality of the normalization system (or method) 100 may be construed as beginning at block 810, where a determination is made as to whether a normalized output is desired. If it is determined that a normalized output is desired, the process may proceed to block 820, where system responses to specific input signals are acquired. In block 830, the one or more inverse transfer functions for the system are computed. In block 840, information regarding current system inputs is received and used to select (block 850) which inverse transfer function (if more than one is available) is suited to the current operational regime. Note, the selection of inverse transfer functions need not be exclusive. For instance, in some embodiments, mixing coefficients can be used to combine two or more inverse transfer functions into a composite inverse transfer function.

Proceeding to block 860, the inverse transfer function and inputs are used to calculate a normalized response. In some embodiments, the response is computed as the convolution of the input signals and the inverse transfer function for the system. In block 870, information corresponding to a selected risetime is received and then used (block 880) to calculate a filtering function, which is used to filter the response. The normalized response is provided in block 890. A more detailed description of performing differential normalization follows.

The normalization system functionality described before with respect to single-ended normalization is also a good characterization for functionality of the normalization system when operating in a differential mode. However, in the general case, the channels in differential circuits are coupled, i.e., signal changes in one channel affect the signal level in the second channel. In such a case, the transfer function H(s) of the system becomes a matrix n×n, where n is the number of channels. In most cases n=2, and H(s) is a 2×2 matrix.

The transfer matrix H(s) is distinct from the DUT transfer function. H(s) expresses how circuit terminations or loads, e.g., 50 ohm loads, shorts, and open terminations, are transformed into reflected waveforms. While all passive DUTs are linear devices, system behavior as described by H(s) need not be linear. In fact, differential DUTs with coupled channels are non-linear for common mode excitation.

Figure 9:
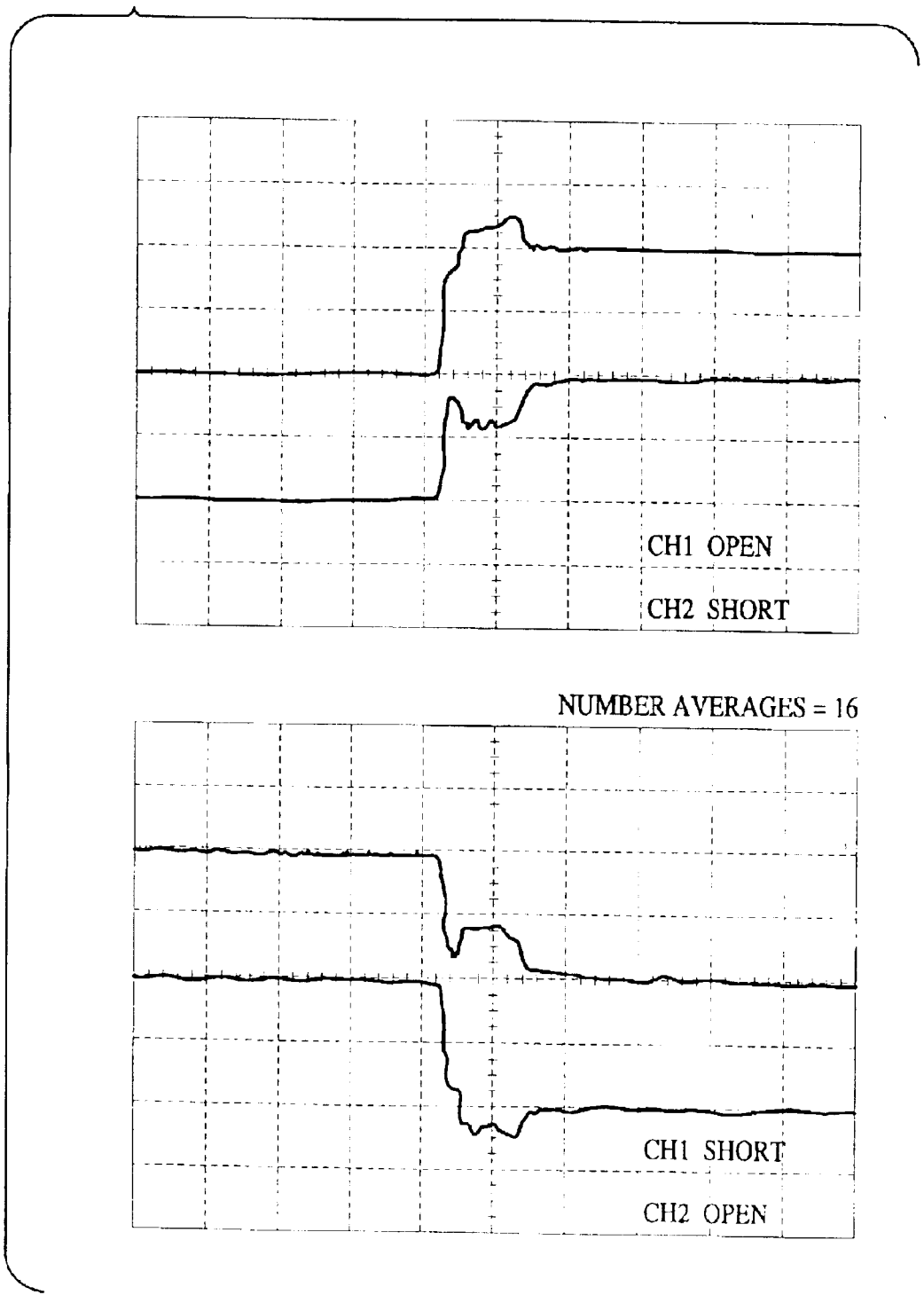
FIG. 9 depicts reflected waveforms for coupled differential circuits under two distinct circuit terminations.

FIG. 9 (top) depicts the reflected waveforms for a coupled differential DUT in which channel 1 has an open circuit termination and channel 2 is connected to a short. FIG. 9 (bottom) depicts the same waveforms, for the case in which channel 1 is connected to a short and channel 2 has an open circuit termination. Note that the asymmetry in terms of circuit terminations does not transfer to the reflected waveforms due to the nonlinearity introduced by near-end crosstalk. The same phenomenon is not present for differential mode excitation. In this case, system behavior as expressed by H(s) is linear.

The behavior of nonlinear systems can be modeled in many ways. For instance, nonlinear systems can be modeled through the construction of global, monolithic models using techniques such as artificial neural networks and the related approximation algorithms described in the literature, or through the physical modeling of the underlying test fixture geometry, and the electromagnetic phenomena related to signal propagation. Collections of locally exact linear models can also be used. Locally exact linear models, which will be described next, require the construction of an adequate number of linear models and the description of a mechanism for selecting which local model to use in each context.

Construction of Local Models for H(s)

The definition of each model involves driving the system with two pairs of known input signals $I_1(s)$ and $I_2(s)$ and observing the corresponding outputs $O_1(s)$ and $O_2(S)$. The derivation of the four elements of H(s) requires the resolution of a system of four linear equations:

For $I_1(s) = [I_{11}(s) I_{12}(s)]^T$ $$\begin{bmatrix} O_{11}(s) \\ O_{12}(s) \end{bmatrix} = \begin{bmatrix} H_{11}(s) & H_{12}(s) \\ H_{21}(s) & H_{22}(s) \end{bmatrix} = \begin{bmatrix} H_{11}(s)I_{11}(s) + H_{12}(s)I_{12}(s) \\ H_{21}(s)I_{11}(s) + H_{22}(s)I_{12}(s) \end{bmatrix}$$

Similarly for $I_2(s) = [I_{21}(s) \; I_{22}(s)]^T$ $$\begin{bmatrix} O_{21}(s) \\ O_{22}(s) \end{bmatrix} = \begin{bmatrix} H_{11}(s) & H_{12}(s) \\ H_{21}(s) & H_{22}(s) \end{bmatrix} \begin{bmatrix} I_{21}(s) \\ I_{22}(s) \end{bmatrix} = \begin{bmatrix} H_{11}(s)I_{21}(s) + H_{12}(s)I_{22}(s) \\ H_{21}(s)I_{21}(s) + H_{22}(s)I_{22}(s) \end{bmatrix}$$

Therefore (removing the indication for explicit dependency on (s) for clarity):

$$H(s) = \begin{bmatrix} H_{11} & H_{12} \\ H_{21} & H_{22} \end{bmatrix} = \frac{1}{I_{11}I_{22} - I_{12}I_{21}} \begin{bmatrix} O_{11}I_{22} - O_{21}I_{12} & O_{21}I_{11} - O_{11}I_{21} \\ O_{12}I_{22} - O_{22}I_{12} & O_{22}I_{11} - O_{12}I_{21} \end{bmatrix}.$$

In the equations above, the input vectors $I_1(s)$ and $I_2(S)$ store the Fourier transform of the derivative of the idealized reflected waveforms for channels 1 and 2, respectively. The idealized reflected waveforms vary according to the circuit termination and the stimulus mode. Each pair of linearly independent vectors $I_1(s)$ and $I_2(s)$ define a locally exact, linear model for the transfer matrix H(s).

The most frequently used terminations are 50Ω loads, as 50Ω is the characteristic impedance widely adopted by PCB, cable and connector manufacturers. The terminations provided by shorts and open circuits correspond to the extreme cases of full subtractive and additive reflection, respectively, and also are used in the construction of the transfer matrix H(s). Given two channels and three possible terminations (short, 50 ohm, and open circuit), nine possible load situations result as listed in Table 1:

| Load ID | Channel 1 | Channel 2 |
|---|---|---|
| L1 | Open | Open |
| L2 | Open | 50 ohm |
| L3 | Open | Short |
| L4 | 50 ohm | Open |
| L5 | 50 ohm | 50 ohm |
| L6 | 50 ohm | Short |
| L7 | Short | Open |
| L8 | Short | 50 ohm |
| L9 | Short | Short |

Pure differential and common mode excitation are readily available in most step generators. The combination of nine load terminations listed in Table 1 and two stimulus mode (differential and common) results in six linearly independent pairs of input vectors $I_1(s)$ and $I_2(s)$. An exhaustive list of the models and the corresponding load situations and input stimulus used in their derivation is presented in Table 2:

| Model ID | Loads used | Stimulus | $I_1(s)$ | $I_2(s)$ |
|---|---|---|---|---|
| M1 | L1 | Diff./Common | $[1 \; -1]^T$ | $[1 \; 1]^T$ |
| M2 | L2, L4 | Diff. | $[1 \; 0]^T$ | $[0 \; -1]^T$ |
| M3 | L3 | Diff./Common | $[1 \; 1]^T$ | $[1 \; -1]^T$ |
| M4 | L6, L8 | Diff. | $[0 \; 1]^T$ | $[-1 \; 0]^T$ |
| M5 | L7 | Diff./Common | $[-1 \; -1]^T$ | $[-1 \; 1]^T$ |
| M6 | L9 | Diff./Common | $[-1 \; 1]^T$ | $[-1 \; -1]^T$ |

At least some embodiments of the normalization system can operate in both differential and common modes that are suitable for the derivation of H(s). Table 2 lists the inputs used in the derivation of each model. Note that inputs are defined by either distinct stimulus or circuit terminations. For instance, the derivation of model M1 is done under load conditions L1. Table 2 establishes that in this case $I_1(s)=[1 -1]^T$ and $I_2(s)=[1\ 1]^T$. Substituting $I_1(s)$ and $I_2(S)$ in the equation above $$H(s) = \begin{bmatrix} H_{11} & H_{12} \\ H_{21} & H_{22} \end{bmatrix} = \frac{1}{2}\begin{bmatrix} O_{11}+O_{21} & O_{21}-O_{11} \\ O_{12}+O_{22} & O_{22}-O_{12} \end{bmatrix},$$

where $O_{11}(s)$ is the FFT for the derivative of the reflected waveform for channel 1 in the differential mode, and $O_{12}(S)$ is the corresponding FFT for channel 2. $O_{21}(s)$ and $O_{22}(s)$ are derived from the reflected waveforms in common mode. The derivative of the inverse transfer matrix $H^{-1}(s)$ requires the inversion of a 2×2 matrix for each frequency component.

During the model construction stage, the normalization system may assist the user by prompting the user to establish a sequence of circuit terminations. For example, in some embodiments, once the user indicates that the required termination is set, the normalization system can automatically acquire the corresponding waveforms for differential and common mode stimuli, as appropriate for each termination.

Note that the list of models in Table 2 contains redundant models for the case in which the test fixture is a symmetric, coupled system. Models M1 and M6, M3 and M5 embody essentially identical information across all frequencies, except in the representation of second order artifacts, e.g., radiation emitted by open terminations. Moreover, the information acquired in load terminations L2, L4, L6, and L8; L1 and L9; and L3 and L7 is also redundant. In summary, for symmetric, coupled differential test fixtures only four load terminations are required (L2, L9, L3, and L5), and three distinct models result.

In the case of symmetrical uncoupled differential fixtures, the off diagonal terms of H(s) are null, and two load terminations (L9 and L5) is required to derive the only model required.

Model Selection

Given the current circuit termination, a model is selected and applied to the calculation of the normalized waveform. Model selection schemes may use: measures of similarity between the waveforms acquired during the model construction stage and the current waveforms; the history of past selections; statistical classifiers based on parametric and non-parametric models; and feedback control loops involving mixing coefficients and reconstruction error among other strategies.

The selection scheme described here has two stages. First, a determination is made as to which class of models appropriately reflects the current circuit termination. The collection of models is partitioned into two classes, namely the class of models derived from data acquired under purely differential stimuli (L1 and L9), and the class of remaining models constructed with data acquired under mixed mode (differential and common mode) stimuli. The determination of which class of models to employ can be based on the relative magnitudes of the differential and common mode components of the input signals.

Second, a model within the class of models chosen in the first stage that best reflects current circuit terminations is selected. This selection can be based on similarity measures between current input waveforms and the waveforms stored during the model construction stage. Similarity between waveforms can be measured in many ways, including template matching, through the use of generative models, principal component analysis (PCA), and others. The method described here is based on the distance metric D, a measure of the total distance in absolute units between the current channel waveforms and the stored waveforms. For instance, if the waveforms are represented as linear arrays of length n, then the distance Dij between channel i waveform CWi and stored waveform SWij is computed as $$Dij = \sum_{k=1}^{n} |CWi(k) - SWij(k)|.$$

The metric D is a matrix of n×m, where n is the number of channels (usually n=2) and m is the number of models. Smaller values of Dij indicate greater similarity between CWi and SWij. The model used in the construction of the normalized response r, is the model that best matches the waveform in channel i (CWi), as measured by the distance metrics Dij, for j=1,m.

Figure 10:
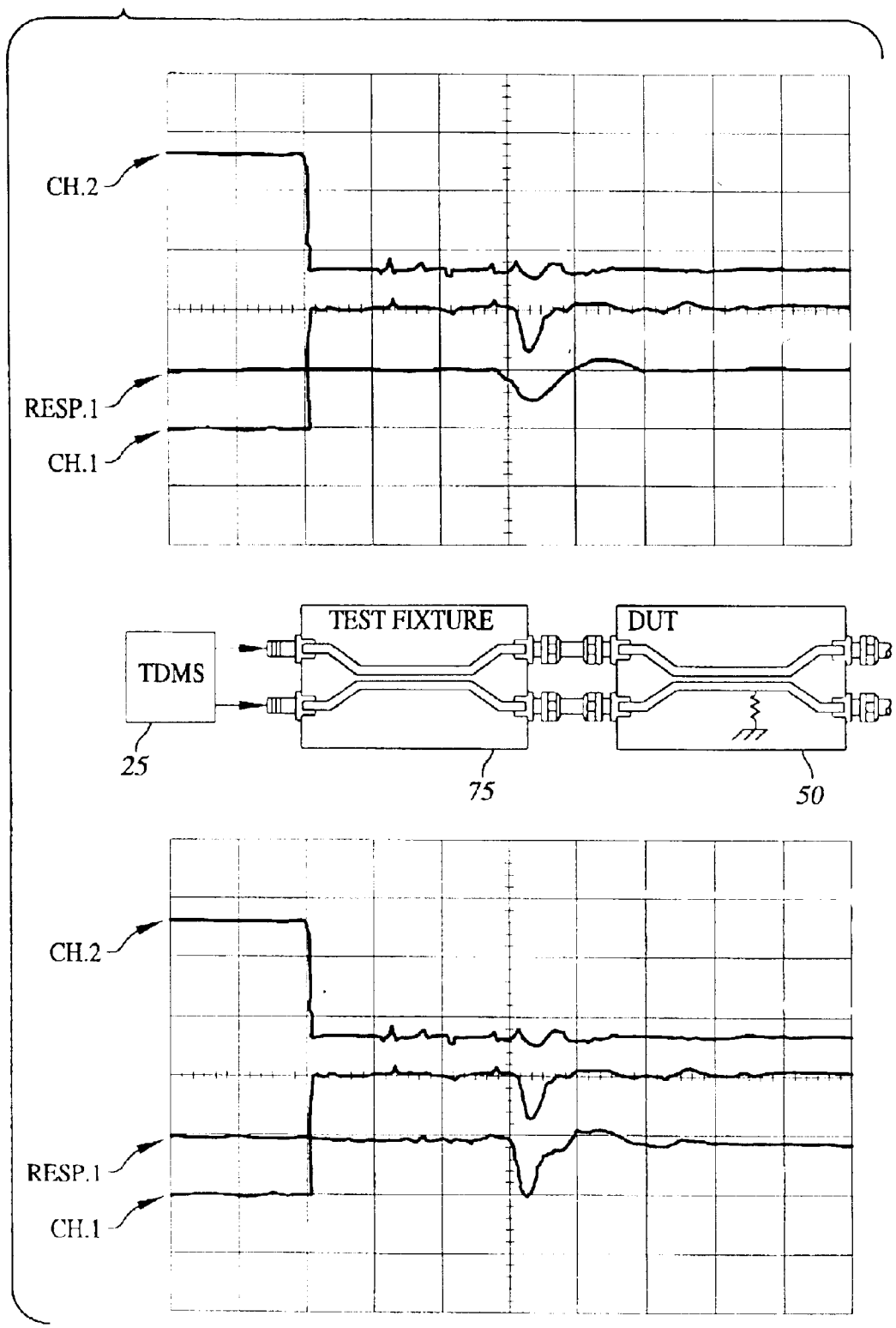
FIG. 10 is a schematic diagram depicting the system of FIG. 5 that correlates various features of the system with a representative reflected waveform with test fixture errors removed.

FIG. 10 depicts the normalized response obtained for a coupled test fixture, for the risetime of 200 ps (bottom pane) and 1 ns (top pane). FIG. 10 illustrates how the invention may be used to compensate for connector reflections and to evaluate the effects of impedance discontinuities for pulses of several risetimes. Advantages similar to these exhibited by the single-ended normalization procedure can be achieved through the use of differential normalization. For example, impedance, reflection coefficient and/or voltage measurements may exhibit higher accuracy, and better resolution in resolving adjacent impedance discontinuities can be achieved. Additionally, more application-specific waveform information can be extracted as the pulse risetime can be programmed. Masking of primary reflections also can be prevented. Moreover, differential normalization can compensate for coupling effects between traces of the test fixture. Note, in FIG. 10, a DC offset was added to the channel waveforms in order to improve the visualization of the waveform features.

The foregoing description has been presented for purposes of illustration and description. It is not intended to be exhaustive or to limit the invention to the precise forms disclosed. Modifications or variations are possible in light of the above teachings. The embodiment or embodiments discussed, however, were chosen and described to provide the best illustration of the principles of the invention and its practical application to thereby enable one of ordinary skill in the art to utilize the invention in various embodiments and with various modifications as are suited to the particular use contemplated.

What is claimed is:

1. A method for performing time domain measurements of a device under test (DUT), said method comprising:

providing a model of a test system used for providing differential input signals to a DUT;

receiving information corresponding to first and second differential input signals provided to the DUT;

receiving information corresponding to first and second reflected waveforms corresponding to the DUT response to the first and second differential input signals; and computing first and second normalized waveforms using at least a first inverse transfer function of the test system, the first and second normalized waveforms including fewer test system error components than the first and second reflected waveforms, respectively.

2. The method of claim 1, wherein providing a model of a test system comprises:

driving the test system using differential and common mode input signals; and observing the test system response to the input signals.

3. The method of claim 2, wherein driving the test system using differential and common mode input signals is accomplished over multiple load terminations of the DUT.

4. The method of claim 3, wherein multiple load terminations include open circuit, short circuit and 50Ω.

5. The method of claim 1, wherein providing a model of a test system comprises:

providing multiple models of the test system, the multiple models corresponding to various combinations of differential mode input signals, common mode input signals and load terminations; and selecting one of the test models for use in computing the first and second normalized waveforms.

6. The method of claim 5, wherein selecting one of the test models is based on at least one of: a similarity between the first and second differential input signals and waveforms associated with the test model selected; and a previously selected test model.

7. The method of claim 6, wherein the test model selected corresponds to a smallest distance metric with respect to the first and second differential input signals.

8. The method of claim 1, wherein computing first and second normalized waveforms comprises:

receiving information corresponding to a selected risetime; and modifying the first and second normalized waveforms based on the risetime selected.

9. The method of claim 1, wherein the first and second differential input signals exhibit coupling effects; and wherein computing first and second normalized waveforms comprises:

compensating for at least some of the coupling effects.

10. The method of claim 1, further comprising:

displaying the first and second normalized waveforms.

11. A system for performing time domain measurements of a device under test (DUT), said system comprising:

a normalization system operative to receive information corresponding to a model of a test system used for providing differential input signals to a DUT, receive information corresponding to first and second differential input signals provided to the DUT, receive information corresponding to first and second reflected waveforms corresponding to the DUT response to the first and second differential input signals, and compute first and second normalized waveforms using at least a first inverse transfer function of the test system, the first and second normalized waveforms including fewer test system error components than the first and second reflected waveforms, respectively.

12. The system of claim 11, further comprising:

means for generating the differential input signals provided to the DUT.

13. The system of claim 11, further comprising:

a signal generator communicating with said normalization system, said signal generator being operative to generate the differential input signals provided to the DUT.

14. The system of claim 13, further comprising:

a test fixture operative to receive the differential input signals from said signal generator and provide the differential input signals to the DUT.

15. The system of claim 13, further comprising:

a modeling system communicating with said normalization system, said modeling system being operative to provide multiple models of said test system, the multiple models corresponding to various combinations of differential mode input signals, common mode input signals and load terminations of the DUT.

16. The system of claim 15, wherein said normalization system is operative to select one of the test models provided by said modeling system for use in computing the first and second normalized waveforms.

17. The system of claim 11, further comprising:

an oscilloscope operative to display the first and second normalized waveforms.

18. A computer-readable medium for performing time domain measurements of a device under test (DUT), said computer-readable medium comprising:

logic configured to provide a model of a test system used for providing differential input signals to a DUT;

logic configured to receive information corresponding to first and second differential input signals provided to the DUT;

logic configured to receive information corresponding to first and second reflected waveforms corresponding to the DUT response to the first and second differential input signals; and logic configured to compute first and second normalized waveforms using at least a first inverse transfer function of the test system, the first and second normalized waveforms including fewer test system error components than the first and second reflected waveforms, respectively.

19. The computer-readable medium of claim 18, wherein the logic configured to provide a model of a test system comprises:

logic configured to drive the test system using differential and common mode input signals; and logic configured to observe the test system response to the input signals.

20. The computer-readable medium of claim 18, wherein the logic configured to provide a model of a test system comprises:

logic configured to provide multiple models of the test system, the multiple models corresponding to various combinations of differential mode input signals, common mode input signals and load terminations.

21. The computer-readable medium of claim 18, wherein the logic configured to compute first and second normalized waveforms comprises:

logic configured to receive information corresponding to a selected risetime; and logic configured to modify the first and second normalized waveforms based on the risetime selected.

* * * * *